United States Patent [19]
Gotoh

[11] Patent Number: 6,002,699
[45] Date of Patent: Dec. 14, 1999

[54] SEMICONDUCTOR LASER DRIVE CIRCUIT

[75] Inventor: Atsunobu Gotoh, Ohita, Japan

[73] Assignee: Texas Instruments Incorporated, Dallas, Tex.

[21] Appl. No.: 09/031,904

[22] Filed: Feb. 27, 1998

[51] Int. Cl.⁶ .................................................. H01S 3/103
[52] U.S. Cl. .................................................. 372/38
[58] Field of Search .................................. 372/38, 43–46

[56] References Cited

U.S. PATENT DOCUMENTS

| | | | |
|---|---|---|---|
| 5,513,197 | 4/1996 | Koishi | 372/38 |
| 5,598,040 | 1/1997 | Markis | 372/38 X |
| 5,651,017 | 7/1997 | Genovese | 372/38 |
| 5,793,786 | 8/1998 | Furumiya | 372/38 |

*Primary Examiner*—John D. Lee
*Attorney, Agent, or Firm*—William B. Kempler; Richard L. Donaldson

[57] ABSTRACT

To offer a semiconductor laser drive circuit which can realize high-speed driving of the semiconductor laser. The drive current supply circuit consists of at least 2 diodes D101 and D102 which are connected in series from the bases of the current supply transistors N102 and N103 in a forward direction for the signal output line; data input circuit, which maintains the signal output node ND30 at ground potential when the input signal is at a high-level and maintains the signal output node ND30 at the level of the power supply voltage Vcc when it is at a low level; and a quick-start circuit 50, which consists of a Schottky diode DX501 whose anode is connected to the bases of the current supply transistors N202 and N203 of the bias circuit 20, and a transistor N501 whose base is connected to the cathode of the Schottky diode DX501, whose emitter is connected between the connection point between the 2 diodes D101 and D102, and the collector is connected to the collector of the current supply transistor N103.

3 Claims, 2 Drawing Sheets

SEMICONDUCTOR LASER DRIVE CIRCUIT

FIELD OF THE INVENTION

The present invention concerns a drive circuit for a semiconductor laser which is used, for example, in printing devices that adopt an electronic photographic method, such as LBP and PPC.

BACKGROUND OF THE INVENTION

In an LBP and PPC, laser light from a semiconductor laser is irradiated over a photosensitive drum in accordance with the video data, such as letters and picture image data, and the aforementioned video data is printed by using a toner by the condition of electrification in accordance with the condition of irradiation.

Semiconductor lasers that are adopted in such an LBP, for example, include anode stem types, in which the anode of the semiconductor laser diode is connected to the power source side, and the current drive circuit is connected to the cathode, and cathode stem types, in which the cathode of the semiconductor laser diode is connected to the power source (ground) side, and the current drive circuit is connected to the anode side.

Of these 2 types of semiconductor lasers, cathode stem type semiconductor lasers are often used from the standpoint of design and reliability, for example.

FIG. 2. is a circuit diagram which shows the structural example of a conventional current drive circuit in a cathode stem type semiconductor laser.

This current drive circuit DRV consists of a drive current switching circuit 10, bias current supply 20, data input circuit 30, and a semiconductor laser 40.

The drive current switching circuit 10 supplies or stops the supply of the drive current ISW to the semiconductor laser 40 in accordance with the data that is input through the data input circuit 30.

Also, the bias circuit 20 supplies the bias current Ib to the semiconductor laser 40.

The drive current ISW and the bias current Ib are supplied to the current supply terminal NDLD, which is a connecting node of the drive current switching circuit 10, bias current supply 20, and the semiconductor laser 40.

In the current drive circuit DRV in FIG. 2, the drive current switching circuit 10 consists of an op amp OP101, npn transistors N101–N104, pnp transistors P101–P103, current-setting resistor R101, and diodes D101 and D102 that are connected in series.

Also, the bias current 20 consists of an op amp OP201, npn transistors N201–N204, pnp transistors P201–P203, and a current-setting resistor R201.

Also, the data input circuit 30 consists of npn transistors N301–N305, pnp transistor P301, Zener diode ZD301, and resistors R301–R305.

Also, the semiconductor laser 40 consists of a laser diode LD401, photodiode PD401, and a resistor R401.

In this current drive circuit DRV, the value of the drive current ISW is determined by the voltage VIN that is applied to the input terminal TIN1 of the drive current switching circuit 10 and the resistance of the current-setting resistor R101. The current which is generated at the input stage in this manner is supplied to the bases of the drive current ISW supply transistors N102 and N103 through the transistors P101–P103 and N104 which make up a current mirror circuit.

Also, the value of the bias current Ib is determined by the voltage VIN2 that is applied to the input terminal TIN2 of the bias circuit 20, and the resistance of the current-setting resistor R201. The current generated at the input stage in this way is supplied to the bases of the bias current Ib supply transistors N202 and N203 through the transistors P201–P203 and N204, which make up a current mirror circuit. In this way, the bias current Ib is supplied to the current supply terminal NDLD.

Thus, the drive current switching circuit 10 supplies or stops the supply of drive current ISW to the current supply terminal NDLD accordance with the input level of the stream signal/DT (where/indicates active low) of the video data, for example, to the data input circuit 30.

More precisely, since video data is input at a high level, the output node ND30 of the input circuit 30 is connected to the ground potential Vss. Accordingly, the cathode side potential of the diode D102 is below the anode side potential of the diode D101, which is at the base potential of the drive current supply transistors N102 and N103 of the drive current switching circuit 10. As a result, the diodes D101 and D102 are turned on, the bases of the transistors N102 and N103 are pulled to ground potential Vss, the transistors N102 and N103 are turned off, and the supply of the drive current ISW to the current supply terminal NDLD is stopped.

Accordingly, in this case, only the bias current Ib is supplied to the semiconductor laser 40 and it is maintained in a turn-off bias condition.

On the other hand, when video data is input at a low level, the output node ND30 of the input circuit 30 is maintained at the level of the power supply voltage Vcc. As a result, the diodes D101 and D102 are turned off, the transistors N102 and N103 are turned on, and the drive current ISW is supplied to the current supply terminal NDLD.

Accordingly, in this case, the current ISW+Ib is supplied to the semiconductor laser 40, and, as a result, the laser diode LD401 emits light.

However, in the conventional drive circuit in the cathode stem type semiconductor laser described above, the semiconductor laser could not be rapidly driven from a turned-off state by the current Ib when the drive current ISW was supplied, while controlling the transistors N102 and N103, to a turned-on state by the stream signal of the video data, the emission characteristic became extremely dull, and achieving a high-speed drive was difficult.

The aim of the present invention, in which such a circumstance is considered, is to offer a semiconductor laser drive circuit in which the semiconductor laser can be driven at high speed.

SUMMARY OF THE INVENTION

In attaining the aforementioned aim, the present invention for a drive circuit for a semiconductor laser, in which a turn-off bias can be maintained by the bias current supplied from a current supply terminal, and which changes to the light-emitting state while receiving a drive current supplied from the aforementioned current supply terminal from said turn-off bias state, has a bias current supply, which has a first current supply transistor and which maintains the base potential of said first current supply transistor above the potential of the aforementioned current supply terminal, at a potential that is at least higher than the base-emitter voltage, and which supplies the aforementioned bias current to the current supply terminal for the aforementioned semiconductor laser; and a drive current supplying circuit which has a second current supply transistor, which maintains the base potential of the aforementioned second current supply transistor at a third level when the input signal is at the first level, and which supplies the aforementioned drive current to the aforementioned current supply terminal, maintains it below the aforementioned third level when the input signal is at the second level, and also maintains the base potential of the aforementioned second current supply transistor at a fourth level that is below the base-emitter voltage of the transistor, based on the aforementioned potential of the current supply terminal.

Also, the aforementioned drive current supply circuit has a Schottky diode whose anode is connected to the base of the first current supply transistor of the aforementioned bias current supply, and a circuit that maintains the base potential of the aforementioned second current supply transistor at a potential that is below the base-emitter voltage of the transistor by voltage drop across said Schottky diode based on the aforementioned potential of the current supply terminal when the input signal is at the second level.

Also, the aforementioned drive current supply circuit ideally has at least 2 diodes which are connected in series from the base of the aforementioned second current supply transistor in a forward direction for the signal output line; a data input circuit which maintains the aforementioned signal output line at ground potential when the input signal is at the second level, and which maintains the aforementioned signal output line at at least a potential that is higher by the voltage drop across the aforementioned 2 diodes when it is at the first level; and a quick-start circuit which consists of a Schottky diode whose anode is connected to the base of the first current supply transistor of the aforementioned bias current supply, and a transistor whose base is connected to the cathode of said Schottky diode, whose emitter is connected to the connection point between the aforementioned 2 diodes, and whose collector is connected to the collector of the aforementioned second current supply transistor.

In the semiconductor laser drive circuit of the present invention, the base potential of the first current supply transistor of the bias current supply is maintained at a prescribed voltage, which is higher than the potential of the current supply terminal, and which is at least higher than the base-emitter voltage. In this way, the bias current is supplied to the semiconductor laser through the current supply terminal, and the semiconductor laser is maintained in a turn-off bias state.

When the level of the input signal in this state is at the second level, the base potential of the second current supply transistor of the drive current supply circuit is maintained at a fourth level that is below the base-emitter voltage of the transistor based on the potential of the current supply terminal, which is at a potential that is higher only by the amount 0.15 V, which results when the voltage drop of the Schottky diode, 0.55 V, is subtracted from the base-emitter voltage, 0.7 V, for example. In this way, the second current supply transistor has a supply standby state for the drive current.

As the level of the input signal is switched to the first level in this state, the base potential of the second current supply transistor is increased to the third level, the drive current is supplied to the current supply terminal, and the semiconductor laser is in a light-emitting state.

In this case, because the second current supply transistor has been maintained in the standby state, the drive current will be supplied at high speed.

REFERENCE NUMERALS AND SYMBOLS AS SHOWN IN THE DRAWINGS

DRVa is a current drive circuit of a semiconductor laser, 10 is a drive current switching circuit, OP101 is an op amp, N101–N106 are npn transistors, P101–P103 are pnp transistors, R101 is a current-setting resistor, D101, D102 diodes, 20 is a bias circuit, OP201 is an op amp, N201–N204 are npn transistors, P201–P203 are pnp transistors, R201 is a current-setting resistor, 30 is a data input circuit, N301–N305 are npn transistors, P301 is a pnp transistor, ZD301 is a Zener diode, R301–R305 are resistors, 40 is a semiconductor laser, LD401 is a laser diode, PD401 is a photodiode, R401 is a resistor, 50 is a quick-start circuit, DX501 is a Schottky diode, and N501 is a npn transistor.

DESCRIPTION OF EMBODIMENTS

Figure 1:
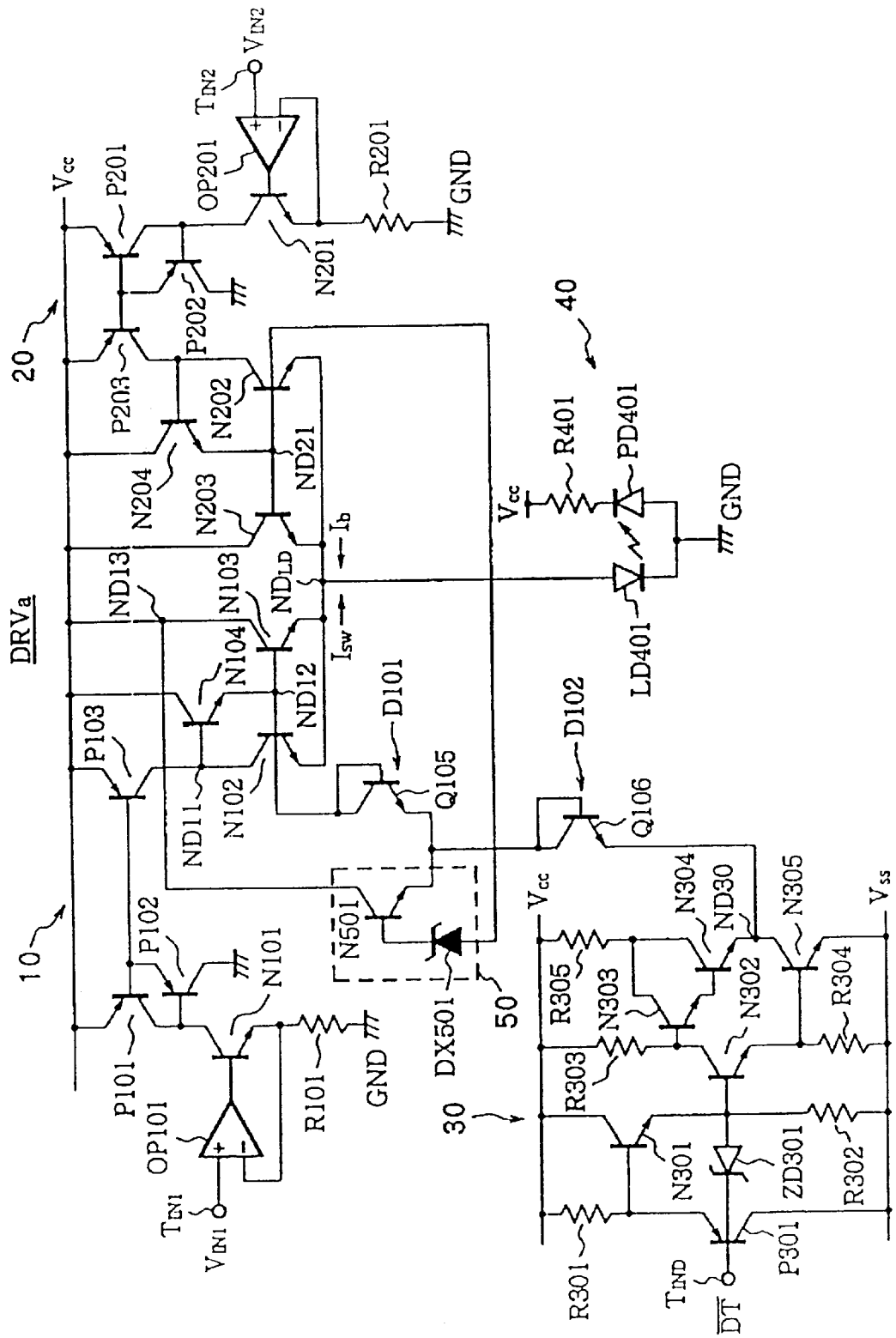
FIG. 1 is a circuit diagram which shows an embodiment form of the current drive circuit in the cathode stem type semiconductor laser of the present invention.
Figure 2:
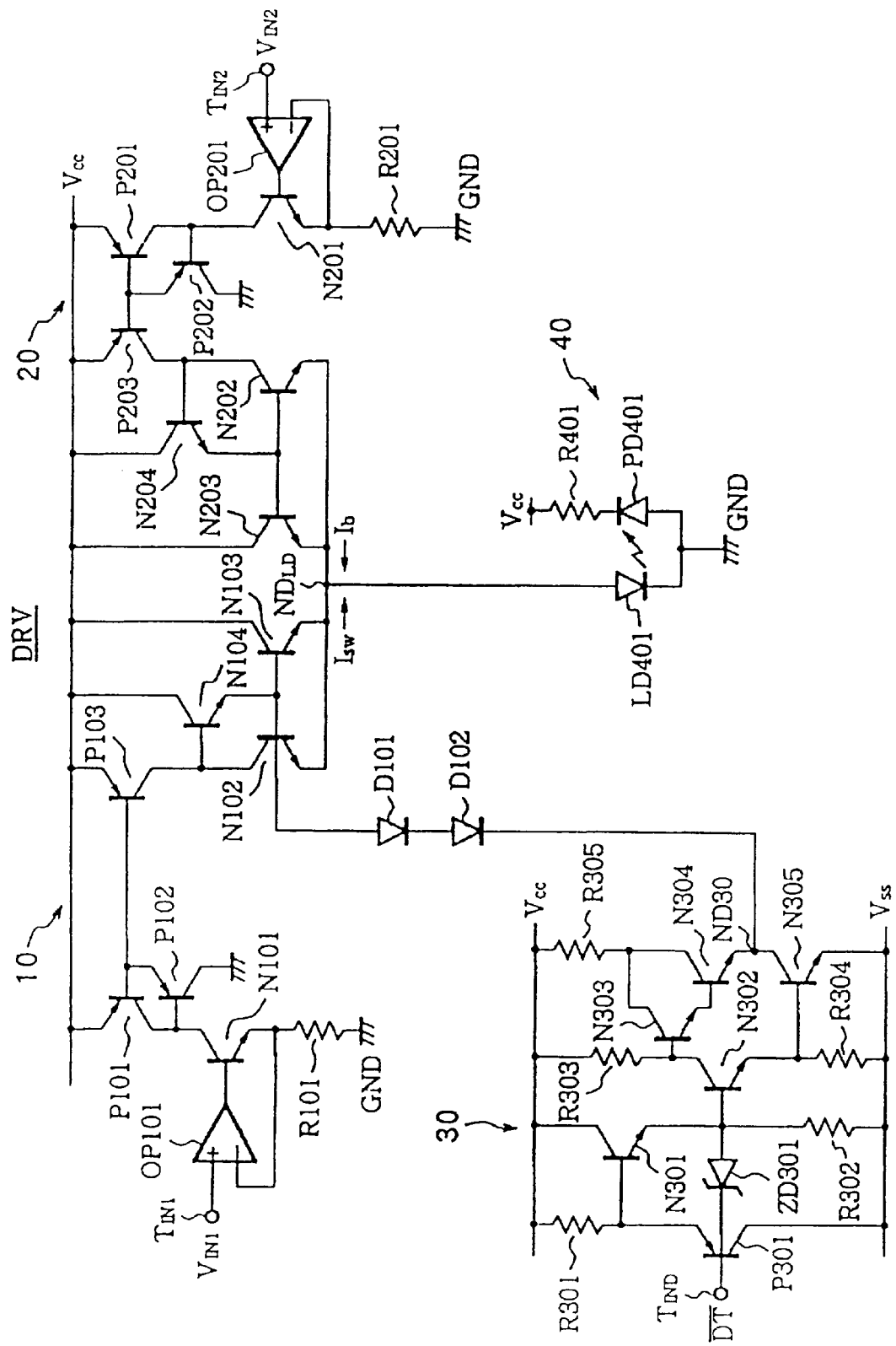
FIG. 2 is a circuit diagram which shows a structural example of the current drive circuit of a conventional cathode stem type semiconductor laser.

FIG. 1 is a circuit diagram which shows an embodiment of the current drive circuit in a cathode stem type semiconductor laser.

The current drive circuit DRVa consists of a drive current switching circuit 10, bias circuit 20, data input circuit 30, semiconductor laser 40, and a quick-start circuit 50.

The drive current switching circuit 10, data input circuit 30, and the quick-start circuit 50 make up the drive current supply circuit.

The drive current switching circuit 10 supplies or stops the supply of drive current ISW to the semiconductor laser 40 in accordance with the data input through the data input circuit 30.

Specifically, the drive current switching circuit 10 consists of an op amp OP101, npn transistors N101–N104, pnp transistors P101–P103, current-setting resistor R101, and diodes D101 and D102 which are connected between the base and collector of the npn transistors N105 and N106 that are connected in series.

In the drive current switching circuit 10, the noninverting input (+) of the op amp OP101 is connected to the input terminal TIN1, and the output is connected to the base of the transistor N101. The emitter of the transistor N101 is connected to one end of the resistor R101, their connection point is connected to the inverting input (−) of the op amp OP101, and the other end of the resistor R101 is grounded.

The collector of the transistor N101 is connected to the collector of the transistor P101 and the base of the transistor P102. The emitter of the transistor P101 is connected to the supply line of the power supply voltage Vcc, and the base is connected to the emitter of the transistor P102 and the base of the transistor P103. The collector of the transistor P102 is grounded. The emitter of the transistor P103 is connected to the supply line of the power supply voltage Vcc, and the collector is connected to the collector of the transistor N102 and the base of the transistor N104. The base of the transistor N102 is connected to the base of the transistor N103 and the emitter of the transistor N104. The collector of the transistor N104 is connected to the supply line of the power supply voltage Vcc, and the collector of the transistor N103 is connected to the supply line of the power supply voltage Vcc and the quick-start circuit 50.

The emitters of the transistors N102 and N103 are connected to the current supply terminal NDLD for the semiconductor laser 40.

The bases of the transistors N102 and N103 and the collector of the transistor N104 are connected to the anode of the diode D101 (the collector and base of the transistor N105). The cathode of the diode D101 (the emitter of the transistor N105) is connected to the anode of the diode D102 (the collector and base of the transistor B106) and the quick-start circuit 50, and the cathode of the diode D102 (the emitter of the transistor N106) is connected to the output terminal ND30 of the data input circuit 30.

The bias circuit 20 supplies the bias current Ib to the semiconductor laser 40.

Specifically, it consists of an op amp OP201, npn transistors N201–N204, pnp transistors P201–P203, and a current-setting resistor R201.

At the bias circuit 20, the noninverting input (+) of the op amp OP201 is connected to the input terminal TIN2, and the output is connected to the base of the transistor N201. The emitter of the transistor N201 is connected to one end of the resistor R201, and their connection point is connected to the inverting input (−) of the op amp OP201, and the other end of the resistor R201 is grounded.

The collector of the transistor N201 is connected to the collector of the transistor P201 and the base of the transistor P202. The emitter of the transistor P201 is connected to the supply line of the power supply voltage Vcc, and the base is connected to the emitter of the transistor P202 and the base of the transistor P203. The collector of the transistor P202 is grounded. The emitter of the transistor P203 is connected to the supply line of the power supply voltage Vcc, and the collector is connected to the collector of the transistor N202 and the base of the transistor N204. The base of the transistor N202 is connected to the base of the transistor N203 and the emitter of the transistor N204, and their connection node ND21 is connected to the quick-start circuit 50. The collector of the transistor N204 is connected to the supply line of the power supply voltage Vcc, and the collector of the transistor N203 is connected to the supply line of the power supply voltage Vcc.

Then, the emitters of the transistors N202 and N203 are connected to the current supply terminal NDLD for the semiconductor laser 40.

The data input circuit 30 maintains the level of its output node ND30 at the level of the power supply voltage Vcc or the level of the ground potential Vss according to the input level of the stream signal of the video data.

Specifically, it consists of the npn transistors N301–N305, pnp transistor P301, Zener diode ZD301, and resistors R301–R305.

The base of the transistor P301 is connected to the data input terminal TIND and the cathode of the Zener diode ZD301, the emitter is connected to the base of the transistor N301 as well as to the supply line of the power supply voltage Vcc through the resistor R301, and the collector is connected to the ground potential Vss.

The collector of the transistor N301 is connected to the supply line of the power supply voltage Vcc, and the emitter is connected to the anode of the Zener diode ZD301 and the base of the transistor N302, as well as to the ground potential Vss through the resistor R302.

The collector of the transistor N302 is connected to the base of the transistor N303, as well as to the supply line of the power supply voltage Vcc through the resistor R303, and the emitter is connected to the base of the transistor N305, as well as to the ground potential Vss through the resistor R304.

The collector of the transistor N303 is connected to the collector of the transistor N304, as well as to the supply line of the power supply voltage Vcc through the resistor R305, and the emitter is connected to the base of the transistor N304.

The emitter of the transistor N304 is connected to the collector of the transistor N305, and their connection point makes up the output node ND30.

Then, the emitter of the transistor N305 is connected to the ground potential Vss.

The semiconductor laser 40 consists of a laser diode LD401, photodiode PD401, and a resistor R401.

The anode of the diode LD401 is connected to the current supply terminal NDLD, and the cathode is connected to the ground line GND and the anode of the diode PD401. The cathode of the diode PD401 is connected to the supply line of the power supply voltage Vcc through the resistor R401.

The quick-start circuit 50, when the semiconductor laser 40 is in a turned off bias state by the bias circuit 20, utilizes the fact that the potential VLD of the current supply terminal NDLD to the semiconductor laser 40 is maintained at approximately 1.6 V, for example, monitors the level of the node ND21, which is higher than this potential VLD by the amount of the voltage VBE across the base and emitter of the transistor (VLD+VBE), constantly raises the potential of the node ND12 at the drive current switching circuit 10 from the potential VLD of the current supply node NDLD for a specified voltage, for example, by the amount of 0.55 V (Schottky diode voltage), and controls it so that the current supply transistors N102 and N103 can supply the current at high speed when data is input at a low level.

More precisely, the quick-start circuit 50 biases the base potentials of the current supply transistors N102 and N103 to potentials below the voltage VBE across the base and emitter (0.7 V, for example), by an amount which does not turn on the transistor.

Specifically, the base potentials of the current supply transistors N102 and N103 are maintained at potentials of approximately 0.15 V, (the value which results when the voltage drop across the Schottky diode, 0.55 V, is subtracted from the base-emitter voltage, 0.7 V of the transistor) higher than the potential VLD of the current supply terminal NDLD.

The quick-start circuit 50 consists of a Schottky diode DX501 and an npn transistor N501 as shown in FIG. 1, for example.

The anode of the Schottky diode DX501 is connected to the node ND21 of the bias circuit 20, and the cathode is connected to the base of the transistor N501.

The emitter of the transistor N501 is connected to the emitter of the transistor Q105, which is connected by a diode, and the collector is connected to the node ND13 of the drive current switching circuit 10 (the collector of the transistor N103).

The operation of the aforementioned structure will be explained below

In this current drive circuit DRVa, the value of the drive current ISW is determined by the voltage VIN that is applied to the input terminal TIN1 of the drive current switching circuit 10 and the resistance of the current-setting resistor R101. The current which is generated at the input stage in this manner is supplied to the bases of the drive current ISW supply transistors N102 and N103 through the transistors P101–P103 and N104 which make up the current mirror circuit.

Also, the value of the bias current Ib is determined by the voltage VIN2 that is applied to the input terminal TIN2 of the bias circuit 20 and the resistance of the current-setting resistor R201. The current that is generated at the input stage in this manner is supplied to the bases of the bias current Ib supply transistors N202 and N203 through the transistors P201–P203 and N204 that make up the current mirror circuit. In this way, the bias current Ib is supplied to the current supply terminal NDLD.

Since video data is input at the high level in this state, the output node ND30 of the input circuit 30 is connected to ground potential Vss. Accordingly, the cathode side potential of the diode D102 drops below the anode side potential of the diode D101, which is the potential of the node ND12, to which the bases of the drive current supply transistors N102 and N103 of the drive current switching circuit 10 are connected. As a result, the diodes D101 and D102 are turned on, the bases of the transistors N102 and N103 are pulled to ground potential Vss, the transistors N102 and N103 are turned off, and the supply of drive current ISW to the current supply terminal NDLD is stopped.

Accordingly, in this case, only the bias current Ib is supplied to the semiconductor laser 40 and it is maintained in a turned off bias state.

However, during this process, the potential of the node ND21 to which the bases of the bias current supply transistors N202 and N203 at the bias circuit 20 are connected is monitored by the quick-start circuit 50, and the potential of the node NO12 at the drive current switching circuit 10 is constantly raised from the current supply terminal NDLD by only 0.15 V (the value which results when the voltage drop across the Schottky diode 0.55 V, is subtracted from the base-emitter voltage, 0.7 V, of the transistor). In this way, the current supply transistors N102 and N103 can be controlled to a standby state in which the drive current can be supplied at high speed.

Then, as video data is input at a low level, the output node ND30 at the input circuit 30 is maintained at the level of the power supply voltage Vcc. As a result, the diodes D101 and D102 will be turned off, the transistors N102 and N103 turn on at high speed, and thereby supplying drive current ISW to the current supply terminal NDLD at high speed.

Accordingly, in this case, a current ISW+Ib is supplied to the semiconductor laser 40, and as a result, the laser diode LD401 emits light.

As explained above, in this implementation form, the drive current supply circuit consists of at least 2 diodes D101 and D102 which are connected in series from the bases of the current supply transistors N102 and N103 in a forward direction for the signal output line; data input circuit, which maintains the signal output node ND30 at ground potential when the input signal is at a high level and maintains the signal output node ND30 at the level of the power supply voltage Vcc when it is at a low level; and the quick-start circuit 50, that consists of the Schottky diode DX501 whose anode is connected to the bases of the current supply transistors N202 and N203 of the bias circuit 20, and the transistor N501 whose base is connected to the cathode of the Schottky diode DX501, whose emitter is connected to the connection point between the 2 diodes D101 and D102, and whose collector is connected to the collector of the current supply transistor N103, so that high-speed driving of the semiconductor laser can be realized.

Specifically, high-speed driving at a frequency of 20 MHz is possible in a conventional circuit, but the semiconductor laser of the present invention can be driven at a high speed of approximately 100 MHz.

As explained above, high-speed driving of the semiconductor laser can be realized with the present invention.

I claim:

1. A drive circuit for a semiconductor laser, with which a turn-off bias can be maintained by a bias current supplied from a current supply terminal, and which changes to a light-emitting state while receiving a drive current supplied from the current supply terminal from said turn-off bias state comprising:

a bias current supply which has a first current supply transistor and which maintains the base potential of said first current supply transistor above the potential of the current supply terminal, at a potential that is at least higher than the base-emitter voltage, and which supplies the bias current to the current supply terminal for the semiconductor laser;

and a drive current supplying circuit which has a second current supply transistor which maintains the base potential of the second current supply transistor at a third level when the input signal is at the first level, and which supplies the drive current to the current supply terminal, maintains it below the third level when the input signal is at the second level, and also maintains the base potential of the second current supply transistor at a fourth level that is below the base-emitter voltage of the transistor, based on the potential of the current supply terminal.

2. The semiconductor laser drive circuit of claim 1, in which the drive current supply circuit has a Schottky diode whose anode is connected to the base of the first current supply transistor of the bias current supply, and a circuit that maintains the base potential of the second current supply transistor at potential that is below the base-emitter voltage of the transistor by the voltage drop across said Schottky diode based on the potential of the current supply terminal when the input signal is at the second level.

3. The semiconductor laser drive circuit of claim 1, in which the drive current supply circuit has at least 2 diodes which are connected in series from the base of the second current supply transistor in a forward direction for the signal output line;

a data input circuit which maintains the signal output line at ground potential when the input signal is at the second level, and which maintains the signal output line at least a potential that is higher by the voltage drop across the 2 diodes when it is at the first level;

and a quick-start circuit which comprises a Schottky diode whose anode is connected to the base of the first current supply transistor of the bias current supply, and a transistor whose base is connected to the cathode of the said Schottky diode, whose emitter is connected to the connection point between the 2 diodes, and whose collector is connected to the collector of the second current supply transistor.

* * * * *